United States Patent
Chen et al.

(10) Patent No.: US 11,133,340 B2
(45) Date of Patent: Sep. 28, 2021

(54) DEVICE COMPRISING PHOTODIODE AND METHOD OF MAKING THE SAME

(71) Applicant: TAIWAN SEMICONDUCTOR MANUFACTURING CO., LTD., Hsin-Chu (TW)

(72) Inventors: Chia-Chan Chen, Zhubei (TW); Yueh-Chuan Lee, Hsinchu (TW); Ta-Hsin Chen, Taichung (TW); Shih-Hsien Huang, Hsin-Chu (TW); Chih-Huang Li, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/705,091

(22) Filed: Dec. 5, 2019

(65) Prior Publication Data

US 2020/0111820 A1    Apr. 9, 2020

Related U.S. Application Data

(62) Division of application No. 15/690,343, filed on Aug. 30, 2017, now Pat. No. 10,515,989.

(51) Int. Cl.
*H01L 31/103* (2006.01)
*H01L 27/146* (2006.01)

(52) U.S. Cl.
CPC ...... *H01L 27/1461* (2013.01); *H01L 27/1463* (2013.01); *H01L 27/14689* (2013.01); *H01L 27/14612* (2013.01); *H01L 27/14643* (2013.01); *H01L 27/14698* (2013.01)

(58) Field of Classification Search
CPC .......... H01L 27/1462; H01L 27/14625; H01L 27/14601; H01L 27/14629; H01L 27/14609; H01L 27/14643; H01L 27/14683; H01L 31/0236
See application file for complete search history.

(56) References Cited

U.S. PATENT DOCUMENTS

| | | | |
|---|---|---|---|
| 5,120,664 A * | 6/1992 | Murotani | H01L 27/14649 257/E27.136 |
| 5,285,098 A | 2/1994 | Borrello | |
| 6,204,524 B1 | 3/2001 | Rhodes | |
| 6,278,145 B1 * | 8/2001 | Kato | H01L 27/14685 257/292 |
| 6,586,789 B1 * | 7/2003 | Zhao | H01L 27/14656 257/291 |
| 6,611,037 B1 * | 8/2003 | Rhodes | H01L 27/14601 257/462 |

(Continued)

*Primary Examiner* — Mary A Wilczewski
*Assistant Examiner* — Tsz K Chiu
(74) *Attorney, Agent, or Firm* — Duane Morris LLP

(57) ABSTRACT

A photosensor device and the method of making the same are provided. In one embodiment, the device includes at least one pixel cell. The at least one pixel cell includes a substrate formed from a semiconductor material, and includes first and second photosensor regions. The first photosensor region is disposed in the substrate and includes a first dopant of a first conductivity type. The second photosensor region is disposed above the first photosensor region and includes a second dopant of a second conductivity type. The second photosensor region can have an increase in dopant concentration from an outer edge to a center portion therein.

20 Claims, 12 Drawing Sheets

(56) References Cited

U.S. PATENT DOCUMENTS

| | | | |
|---|---|---|---|
| 7,456,452 B2 * | 11/2008 | Wells | H01L 27/14601 257/292 |
| 7,649,201 B2 | 1/2010 | Mouli | |
| 7,659,564 B2 | 2/2010 | Adkisson | |
| 7,763,913 B2 | 7/2010 | Fan | |
| 7,772,625 B2 * | 8/2010 | Liang | H01L 27/14609 257/292 |
| 7,880,255 B2 | 2/2011 | Baggensloss | |
| 8,652,868 B2 | 2/2014 | Shih et al. | |
| 9,318,630 B2 | 4/2016 | Lee | |
| 9,899,435 B2 | 2/2018 | Lee | |
| 10,205,037 B2 * | 2/2019 | Yamashita | H01L 31/02027 |
| 2002/0089004 A1 | 7/2002 | Rhodes | |
| 2003/0044729 A1 * | 3/2003 | Huang | G02B 5/201 430/321 |
| 2005/0053347 A1 * | 3/2005 | West | H01L 31/02327 385/129 |
| 2005/0274988 A1 * | 12/2005 | Hong | H01L 27/14625 257/225 |
| 2007/0114629 A1 * | 5/2007 | Dosluoglu | H01L 27/1463 257/435 |
| 2008/0048283 A1 * | 2/2008 | Han | H01L 27/14609 257/432 |
| 2016/0197118 A1 | 7/2016 | Park | |

* cited by examiner

DEVICE COMPRISING PHOTODIODE AND METHOD OF MAKING THE SAME

CROSS-REFERENCE TO RELATED APPLICATION

The present application is a divisional of U.S. patent application Ser. No. 15/690,343, filed Aug. 30, 2017, the contents of which is incorporated by reference herein in its entirety.

BACKGROUND

This disclosure relates to semiconductor devices and methods of making same. More particularly, the disclosed subject matter relates to a method for making a device having a photodiode structure, and the resulting device.

Complementary Metal-Oxide-Semiconductor (CMOS) image sensors (CIS) are used in numerous applications including digital cameras, for example. For example, image sensors can be used for sensing exposed light projected toward a semiconductor substrate. CMOS image sensors generally include an active region having an array of light sensitive elements (pixels), and a periphery region. These products utilize an array of active pixels (i.e., image sensor elements or cells) including photodiodes and other elements (e.g., transistors) to convert images into digital data or electrical signals. Each of the photodiodes includes a p-type doped region and a n-type doped region to form a p-n junction for transforming photons into electrons when the photodiodes are exposed to light. The photodiodes are characterized by a dark current (DC) or a white pixel (WP) performance. There is a need for photodiodes having better DC and WP performance with minimal image lag.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1:
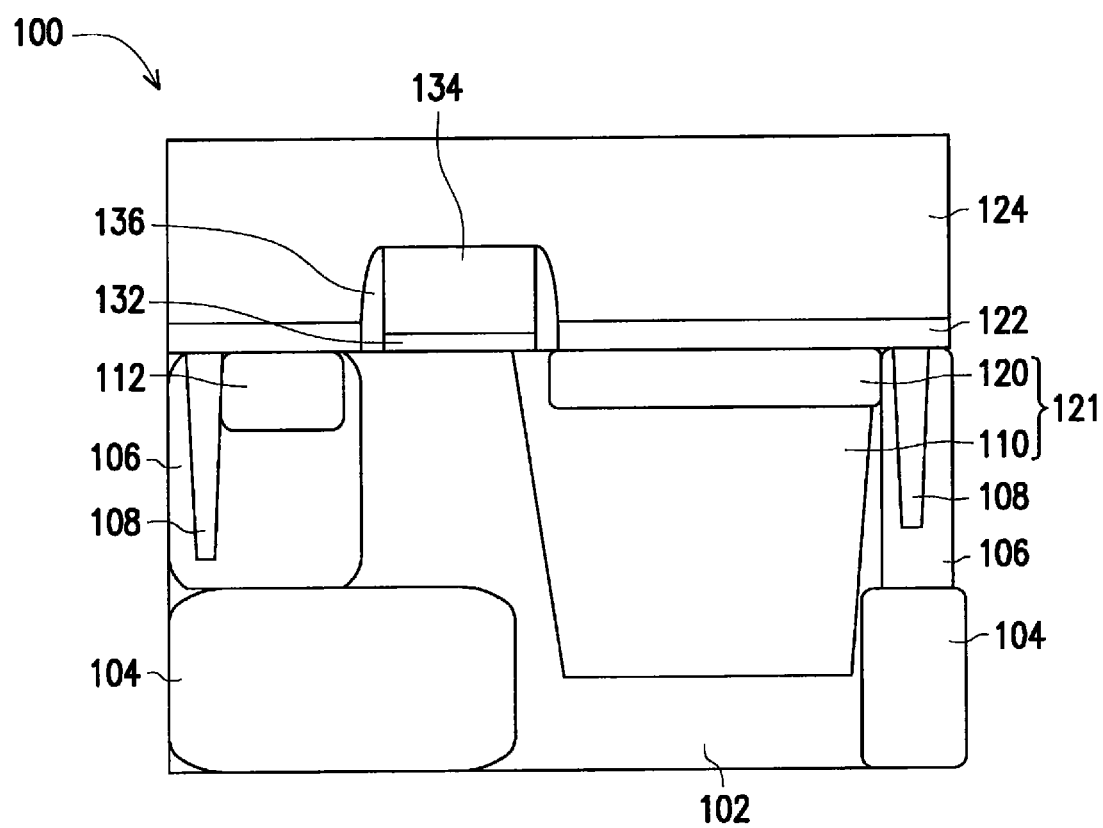
FIG. 1 is a cross-sectional view illustrating an exemplary device comprising one pixel cell in some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a pixel structure (or cell)" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

CMOS image sensors are pixelated metal oxide semiconductors. A CMOS image sensor comprises an array of light sensitive picture elements (pixels), each of which may include transistors (e.g., a switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry comprises a photo-diode formed in a semiconductor (e.g., silicon) substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

Figure 6:
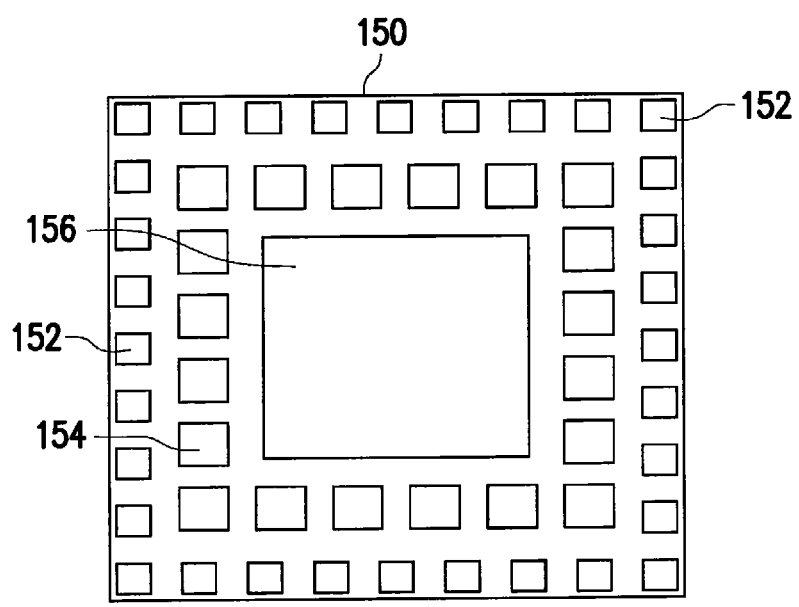
FIG. 6 is a top view illustrating the area of FIG. 4 for applying a second dopant through a plurality of trenches or openings having different sizes to form the second photosensor region in accordance with some embodiments of the present disclosure.
Figure 7:
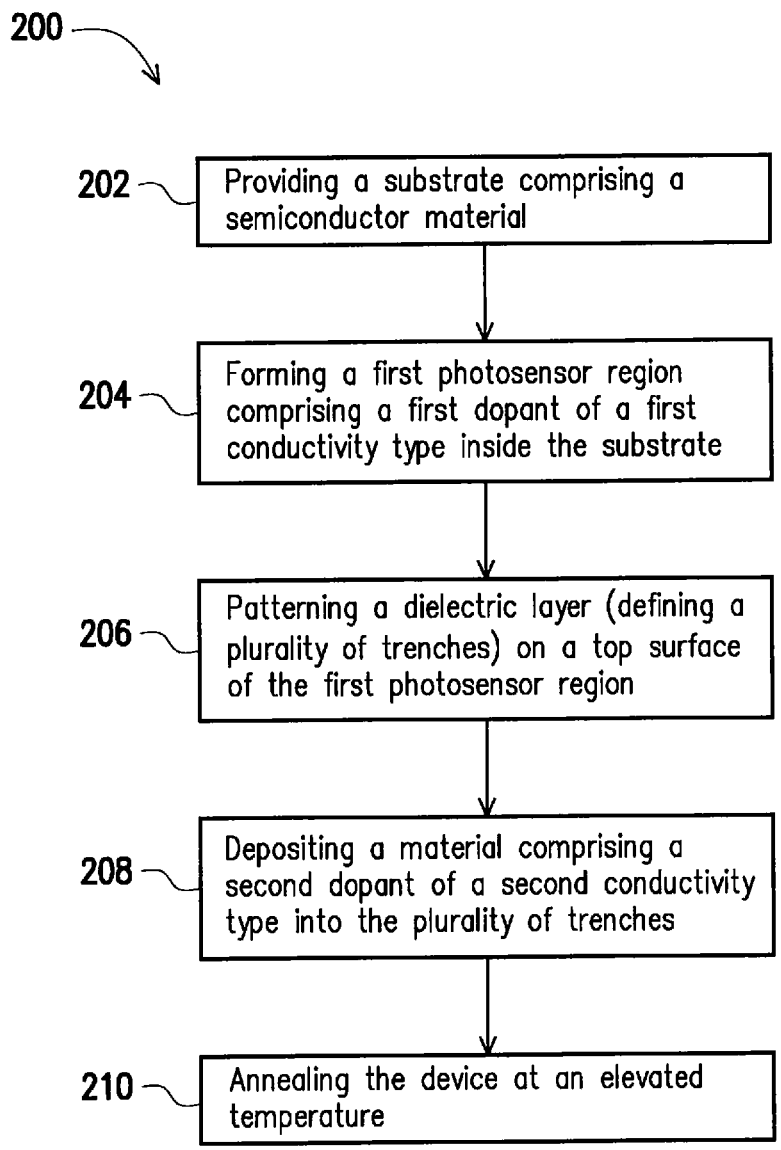
FIG. 7 is a flow chart illustrating an exemplary method for forming a first and a second photosensor regions of a device in accordance with some embodiments.
Figure 8:
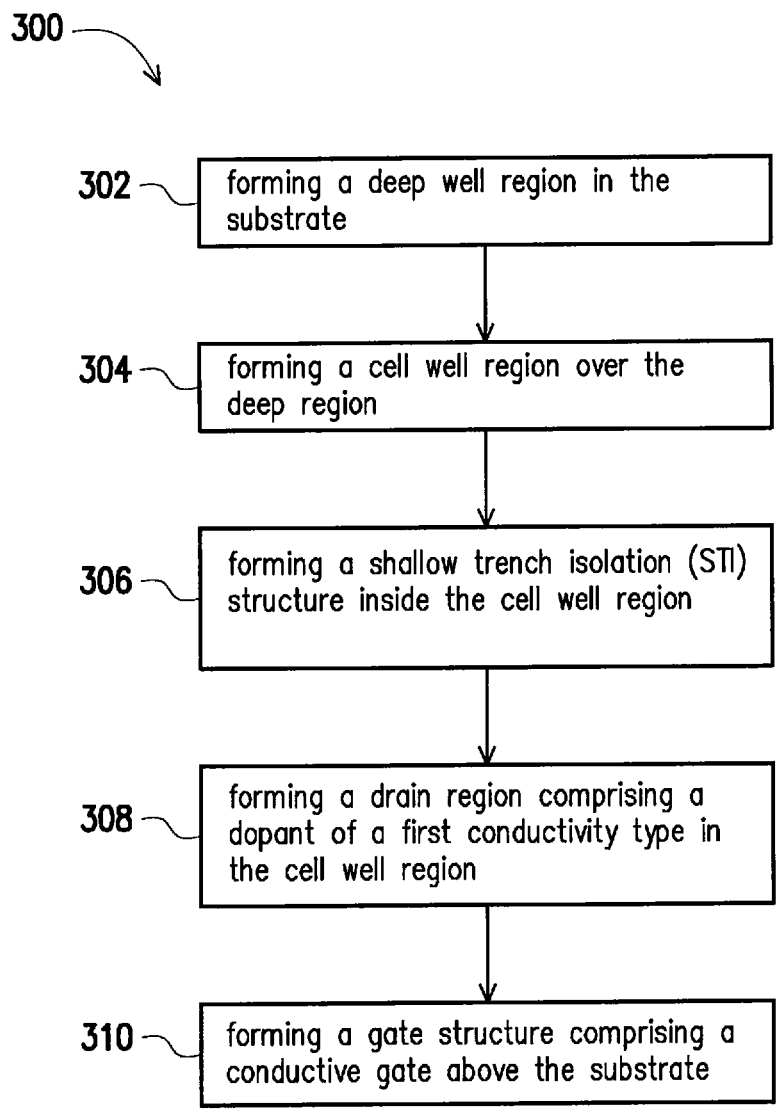
FIG. 8 is a flow chart illustrating an exemplary method for forming peripheral and gate structures of a device in accordance with some embodiments.

The present disclosure provides a device comprising at least one pixel cell, and a method for making the same. In FIGS. 1-14, like items are indicated by like reference numerals, and for brevity, descriptions of the structure, provided above with reference to the preceding figures, are not repeated. The methods described in FIGS. 7-8 are described with reference to the exemplary structure described in FIGS. 1-3 and 5-14. Only one pixel cell (called a pixel structure or photodiode) or a portion of one pixel cell is described in the exemplary structures for illustration.

Referring to FIG. 1, an exemplary device 100 having a pixel structure for a CMOS image sensor is illustrated according to some embodiments. Exemplary device 100 comprises a semiconductor substrate 102, a first photosensor region 110, and a second photosensor region 120. The first photosensor region 110 is disposed in substrate 102 and comprises a first dopant of a first conductivity type being n-type or p-type. The second photosensor region 120 is disposed above the first photosensor region 110 and comprises a second dopant of a second conductivity type being p-type or n-type. In some embodiments, the two photosensor regions 110, 120 have different types of dopants. For example, when the first photosensor region 110 is n-type doped, the second photosensor region 120 is p-type doped in some embodiments.

Substrate 102 comprises a suitable semiconductor material including but not limited to silicon. In some embodiments, substrate 102 is p-type doped semiconductor material. For example, substrate 102 comprises a p-type doped silicon in some embodiments. Substrate 102 may be a p-type epitaxial layer grown from a p-type substrate comprising silicon. Substrate 102 may comprise any suitable p-type dopant such as boron and the like. In some embodiments, substrate 102 has a surface resistance in a range of from about 10 ohm/μm$^2$ to 1,000 ohm/μm$^2$.

In some embodiments, exemplary device 100 comprises a photodiode 121 including an n-type doped region as the first photosensor region 110 disposed inside substrate 102 and a p-type doped region as the second photosensor region 120 in contact with the n-type doped region 110. The n-type doped region is also referred as a n-type photosensor region (NPS) or photoactive region. The p-type doped region is also referred as a p-type photosensor region (PPS) or photoactive region. The first and the second photosensor regions including the n-type doped region and a p-type doped region form a p-n or p-i-n junction for a photodiode.

The n-type doped region as the first photosensor region 110 may be formed by an ion implantation process, for example, performed from the front side of the wafer. A suitable n-type doping material such as phosphorus is doped into substrate 102 to form the n-type doped region 110. In some embodiments, the n-type doped region has a suitable doping concentration, for example, in a range from about $10^{12}$ atom/cm$^3$ to about $10^{13}$ atom/cm$^3$ (e.g., in a range from $3\times10^{12}$ atom/cm$^3$ to $7\times10^{12}$ atom/cm$^3$, or from $4\times10^{12}$ atom/cm$^3$ to $6\times10^{12}$ atom/cm$^3$).

The p-type doped region as the second photosensor region 120 may be formed by using an ion implantation process, for example, performed from the front side of the substrate. In accordance with an embodiment, the p-type doped region is doped with a p-type dopant such as boron and the like. The doping concentration of the p-type doped region 120 is in a range from about $10^{13}$ atom/cm$^3$ to about $10^{14}$ atom/cm$^3$, for example, in a range from about $3\times10^{13}$ atom/cm$^3$ to about $5\times10^{13}$ atom/cm$^3$.

Exemplary device 100 also comprises an isolation region in the pixel structure, as discussed in further detail below. In order to avoid interference from adjacent pixels, at least one isolation region may be employed to prevent cross walk between adjacent pixels. The pixel cell may further comprise a deep well region 104 disposed in substrate 102, a cell well region 106 disposed over the deep well region 104, and a shallow trench isolation (STI) structure 108 comprising an oxide disposed inside the cell well region. The deep well region 104 and the cell well region 106 comprising a dopant of the second conductivity type (e.g., p-type).

In some embodiments, the isolation region includes the deep p-well (DPW) region 104, the cell p-well (CPW) region 106 disposed over the DPW region 104, and the shallow trench isolation (STI) structure 108 disposed inside the CPW region 106. The deep p-well (DPW) region 104 and the cell p-well (CPW) region 106 surround the n-type doped region 110 (i.e. the NPS region).

In some embodiments, the deep well region 104 comprises a semiconductor material such as silicon doped with a p-type dopant such as boron and the like. Deep well region 104 may be formed by implanting such a p-type dopant into substrate 102. In some embodiments, deep well region 104 has a doping concentration in a range from about $10^{10}$ atom/cm$^3$ to about $10^{12}$ atom/cm$^3$, for example, at the magnitude level of $10^{11}$ atom/cm$^3$ (e.g., in a range of from about $2\times10^{11}$ atom/cm$^3$ to about $7\times10^{11}$ atom/cm$^3$).

In some embodiments, the cell well region 106 comprises a semiconductor material such as silicon doped with a p-type dopant such as boron and the like. Cell well region 106 may be formed by implanting such a p-type dopant into substrate 102. In some embodiments, the cell well region 106 has a doping concentration in a range from about $10^{11}$ atom/cm$^3$ to about $10^{13}$ atom/cm$^3$, for example, at the magnitude level of $10^{12}$ atom/cm$^3$ (e.g., in a range of from about $1\times10^{12}$ atom/cm$^3$ to about $6\times10^{12}$ atom/cm$^3$).

In some embodiments, the STI structure 108 may be formed by etching a portion of the substrate to form a trench and filling the trench with oxide and/or other dielectric materials. STI 108 is filled with an oxide material such as silicon dioxide in some embodiments.

In some embodiments, pixel structure in exemplary device 100 further comprises a drain region 112 comprising a dopant of a first conductivity type. In some embodiment, drain region 112 is a n-type doped (n+) region with high concentration of dopants. In some embodiments, drain region 112 has a doping concentration in a range from about $10^{14}$ atom/cm$^3$ to about $10^{16}$ atom/cm$^3$, for example, at the magnitude level of $10^{15}$ atom/cm$^3$ (e.g., in a range of from about $1\times10^{15}$ atom/cm$^3$ to about $9\times10^{15}$ atom/cm$^3$).

Exemplary device 100 can further comprise transistors (switching transistor and reset transistor) and capacitors (not shown). The pixel structure in exemplary device 100 may include other layers such as anti-reflection layer, color filter layer and micro lens layer (not shown). A CMOS image sensor may comprise a plurality of additional layers such as dielectric layers and interconnect metal layers formed on top of the substrate, wherein the interconnect layers are used to couple the photodiode with peripheral circuitry, in accordance with some embodiments. The side having additional layers of the CMOS image sensor is referred to as a front side, while the side having the substrate is referred to as a backside.

In some embodiments, a pixel structure in exemplary device 100 comprises a dielectric (e.g., oxide) layer 122, an inter layer dielectric (ILD) layer 124, and a gate structure comprising a gate oxide layer 132, a conductive gate (e.g., polysilicon or metal gate) 134 and a spacer 136 disposed inside the oxide layer 122 and the ILD layer 124. The gate 134 may be polysilicon doped with arsenic or phosphorous ion in some embodiments. The gate oxide layer 132 may comprise silicon dioxide in a thickness between about 10 Å to about 150 Å. Contact structures (not shown) such as formed from tungsten, aluminum or copper may pass through the ILD 124, such that being electrically connected to the gate structure, the photosensitive regions 110, 120 and the drain region 112.

Figure 2:
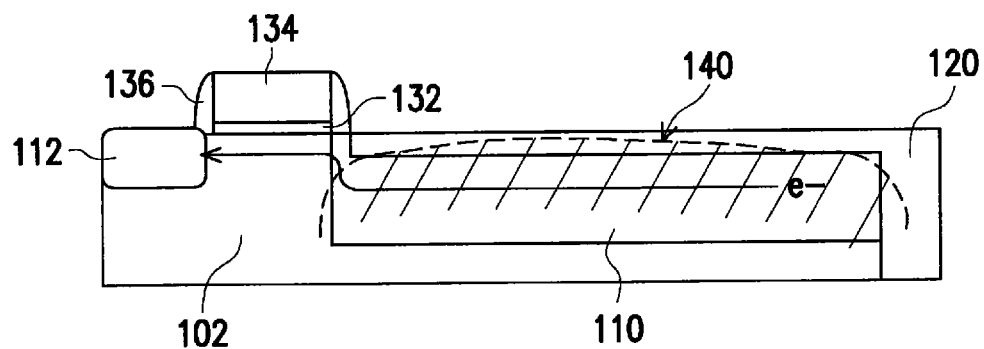
FIG. 2 illustrates a portion of the device of FIG. 1 having a first and a second photosensor regions.
Figure 3:
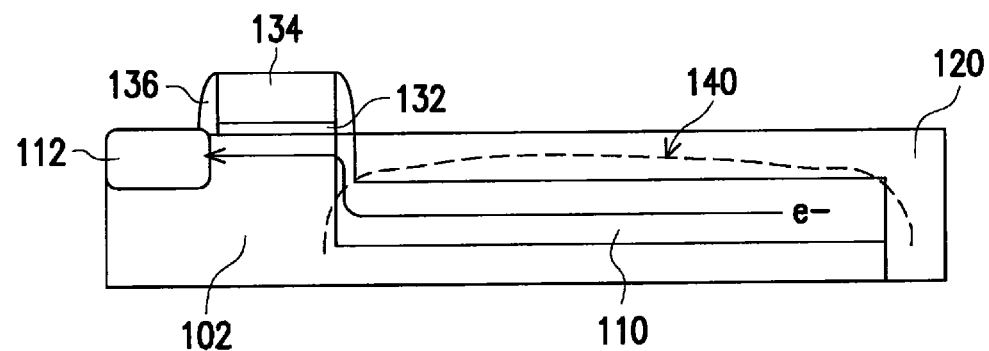
FIG. 3 illustrates a portion of the device of FIG. 1 having an increased second photosensor region disposed above the first photosensor region.

Referring to FIGS. 1, 2 and 3, in some embodiments, the photodiode 121 may be turned on when a voltage such as 2-4 v is applied to gate 134. Light can be applied from bottom or from above (e.g., above pixel structure 100). In some embodiments, substrate 102 and dielectric layer 122 are made of materials such as silicon or silicone based material, and are configured to transmit and/or absorb light. Electrons moves upward toward the depletion zone 140 (illustrated under the dotted line), and then to drain region 112, which has a low electric potential. Depletion zone 140 collects photo electrons.

In a CMOS photo sensor device, the p-type photo active region (i.e. PPS region) 120 is used to isolate surface defects (such as dangling bonds) of silicon to prevent leakage and improve the dark current (DC) and the white pixel (WP) performance. The depletion zone 140 illustrated in FIG. 2 is close to the surface of region 120 and provide good WP performance. The center of depletion zone 140 is closer to the surface in some embodiments.

In some embodiments, deeper and/or higher concentration of p-type doping is needed for some photodiodes, for example, photodiodes of increased dimensions. In some devices with big pixel size, the first photosensor region (e.g., NPS region) 110 may have higher concentration of the first dopants (e.g., n-type dopants) than the surface due to less lateral diffusion of P-well in the center region of the photo diode. In some embodiments, deeper and/or higher concentration of a second dopant (e.g., p-type dopant) are utilized for surface isolation of the center region of the diodes. However, as illustrated in FIG. 3, heavy doping in region 120 by ion implantation moves the depletion zone 140 deeper into the second photosensor region 120 (e.g., a PPS region), and narrows down the pathway for electron transfer, thus causing image lag due to narrower electron transfer pathway.

Figure 4:
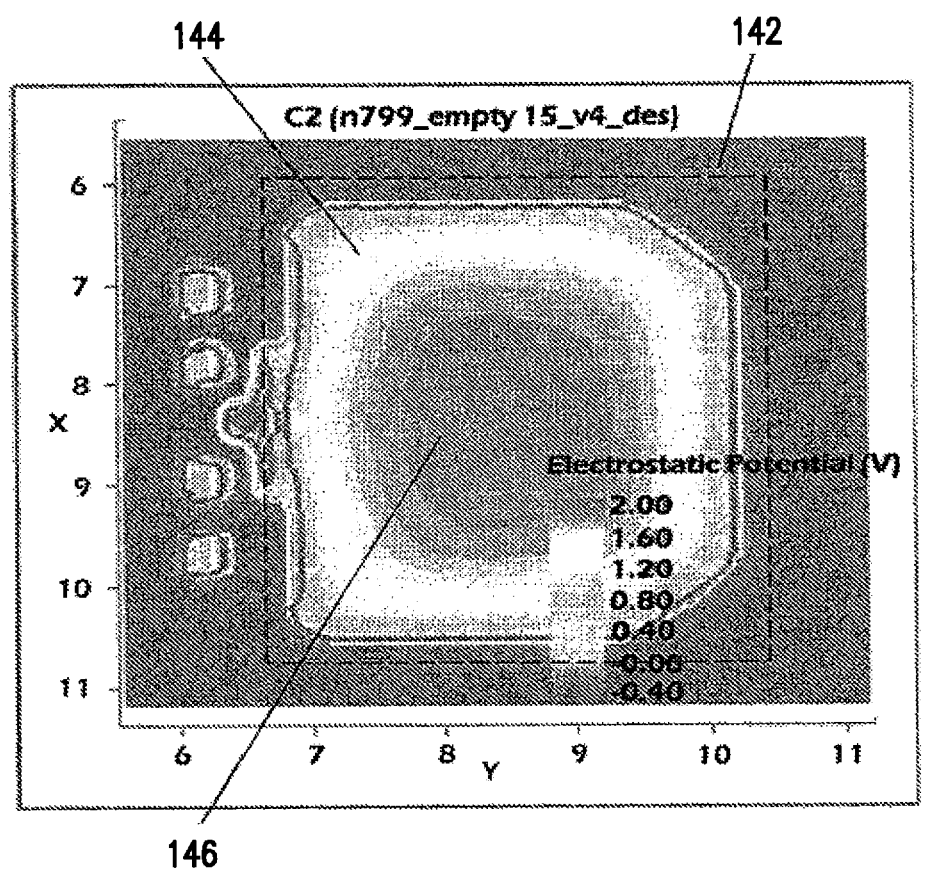
FIG. 4 is a top view illustrating dopant concentration distribution in an area of the first photosensor region.
Figure 5:
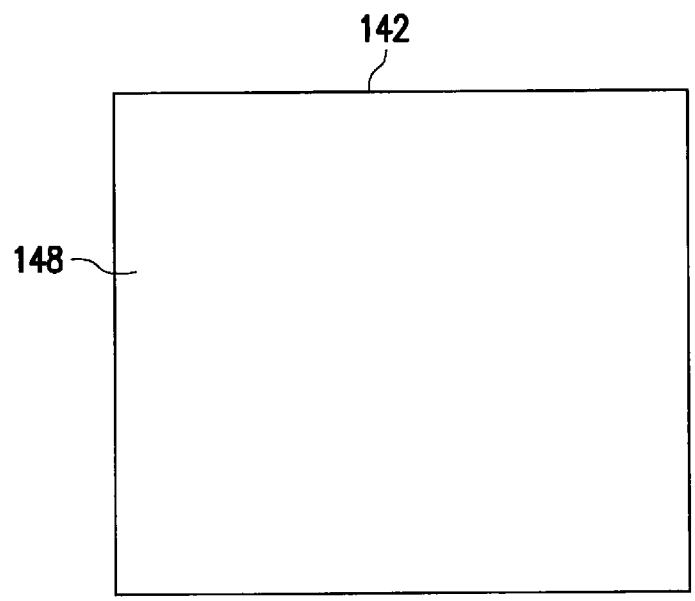
FIG. 5 is a top view illustrating the area of FIG. 4 for doping the first photosensor region with a second dopant to form the second photosensor region in some embodiments.

Referring to FIG. 4 illustrating a top view of an area 142 of the first photosensor region 110, the first dopant (e.g., n-type dopant) has a higher concentration in the center portion 146 than that in the outer edge portion 144. The center portion 146 contains less dopants of the first conductivity type (e.g., p-type) diffused from deep well region 104 and cell well region 106, and thus provides higher electrostatic potential. In one embodiment, referring to FIG. 5, the second dopant for the second photosensor region 120 is applied onto area 142, for example, through a masked opening matching area 142 by using an implantation process. As described above, deeper and/or higher concentration of a second dopant which may be needed might result in image lag, which is less desirable.

Therefore, in one aspect the present disclosure provides a method including depositing a material comprising a second dopant (e.g., a p-type doped epitaxial film) with a hard mask structure to compensate the concentration differences between the center portion and the outer edge portion. Referring to FIG. 6 illustrating an area 150 (similar to matching the area 142), a material comprising a second dopant (e.g., p-type doped epitaxial silicon) is applied to the area 150 through a plurality of trenches or openings 152, 154, 156 having different sizes in accordance with some embodiments. The second dopant is then diffused into the first photosensor region 110 to form the second photosensor region 120. The resulting second photosensor region 120 has an increase in dopant concentration and/or in doping depth toward region 110 from an outer edge to a center portion therein. The resulting device provides good electron pathways, and also provides excellent dark current (DC) and the white pixel (WP) performance without no image lag.

Referring to FIG. 7, an exemplary method 200 is provided in accordance with some embodiments. At step 202, a substrate 102 comprising a semiconductor material as described is provided. In some embodiments, substrate 102 comprises silicon doped with a p-type dopant.

At step 204, a first photosensor region 110 as described is formed inside substrate 102. The first photosensor region 110 comprises a first dopant of a first conductivity type being n-type or p-type. In some embodiments, the first photosensor region 110 comprises silicon and the first dopant is n-type.

Figure 9:
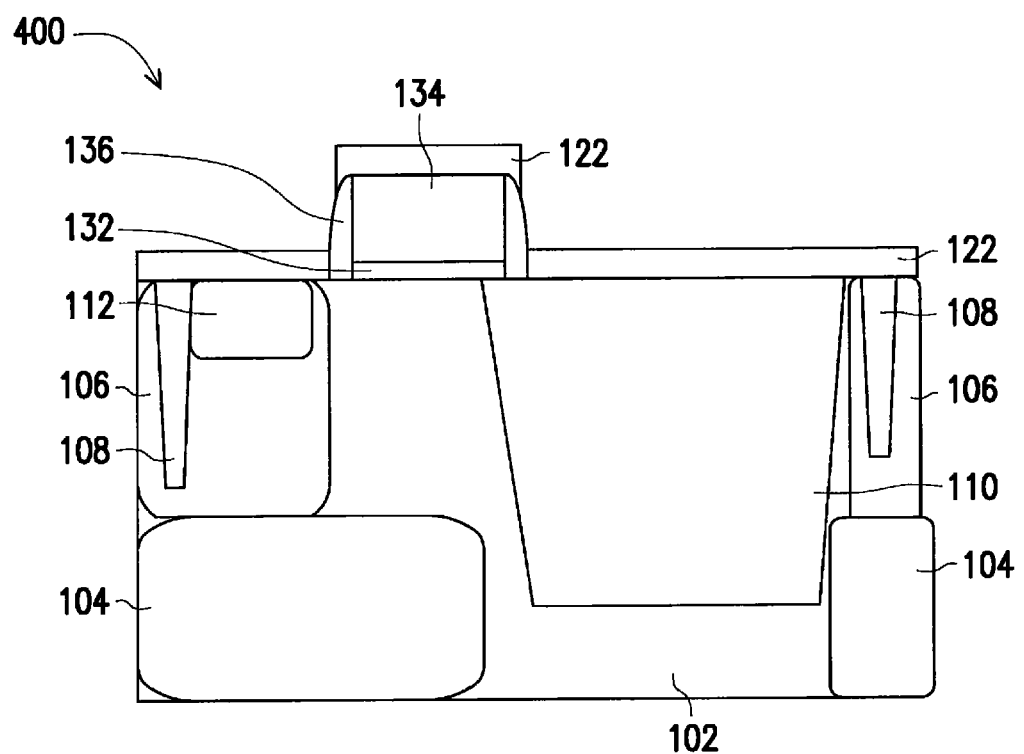
FIGS. 9-13 are cross-sectional views of a portion of a device during fabrication, illustrating a method of forming a device in accordance with some embodiments.

Exemplary method 200 may further comprise the steps of forming peripheral structures such as isolation regions, transistors and gate structures. Some of these steps are illustrated in an exemplary method 300 of FIG. 8. Steps 302, 304, 306, 308 and 310 may be performed after step 202 and/or step 204 and before step 206 in some embodiments. Steps 302, 304, 306, 308 and 310 may be performed in any suitable order. An exemplary resulting structure 400 is illustrated in FIG. 9.

At step 302, a deep well region 104 as described is formed in substrate 102.

At step 304, a cell well region 106 as described is formed over the deep well region 104. The deep well region 104 and the cell well region 106 comprises a dopant of the second conductivity type (e.g., p-type). In some embodiments, region 104 is a deep p-well (DPW) region, which comprises p-type doped silicon. Region 106 is a cell p-well (CPW) region, which comprises p-type doped silicon. The deep p-well (DPW) region 104 and the cell p-well (CPW) region 106 surround the n-type doped region 110 (i.e. the NPS region).

At step 306, a shallow trench isolation (STI) structure 108 as described is formed inside the cell well region 106. STI structure 108 is filled with silicon dioxide in some embodiments.

At step 308, a drain region 112 as described comprising a dopant of a first conductivity type (e.g., n-type, N+ region having high concentration of n-type dopant) is formed in the cell well region 106.

At step 310, a gate structure comprising conductive gate 134 as described is formed above the substrate. The gate structure may also include gate oxide layer 132 below the conductive gate 134, and spacer 136.

Referring back to FIG. 2, at step 206, dielectric layer or hard mask 122 is patterned on a top surface of the first photosensor region 110. Referring to FIG. 9, dielectric layer or hard mask 122 is first coated onto the first photosensor region 110. Examples of a suitable material for dielectric layer or hard mask 122 include but are not limited to silicon oxide, silicon nitride (e.g., $Si_3N_4$), SiON, SiC, SiOC, or any combination thereof. The dielectric layer comprises silicon dioxide in some embodiments.

Figure 10:
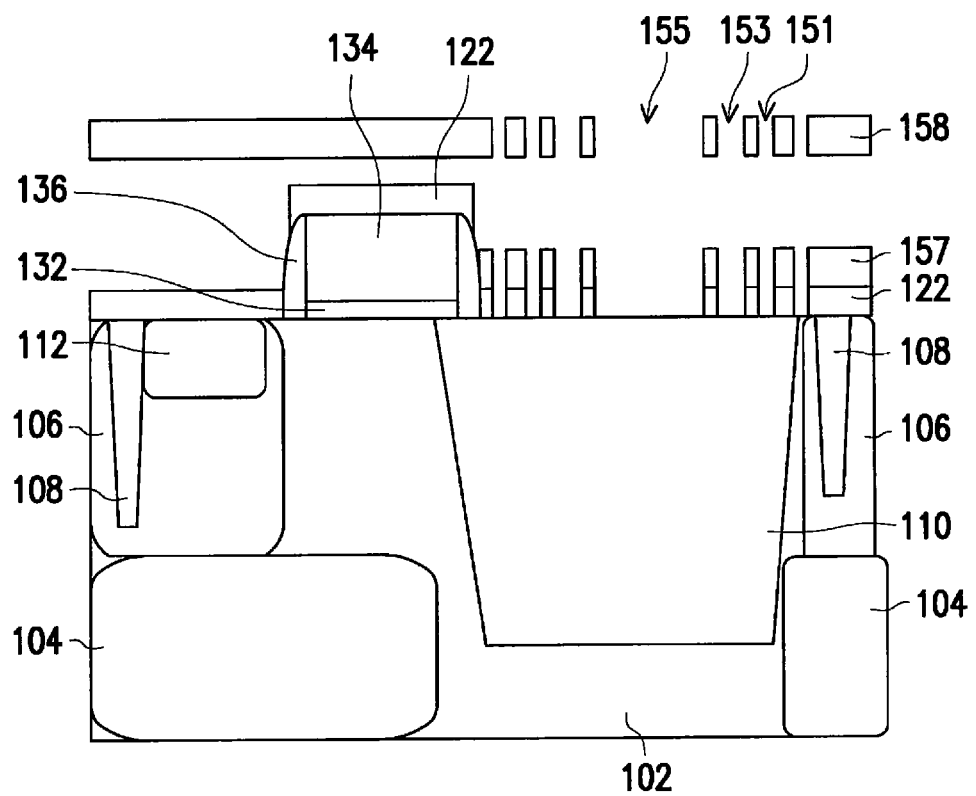
Figure 11:
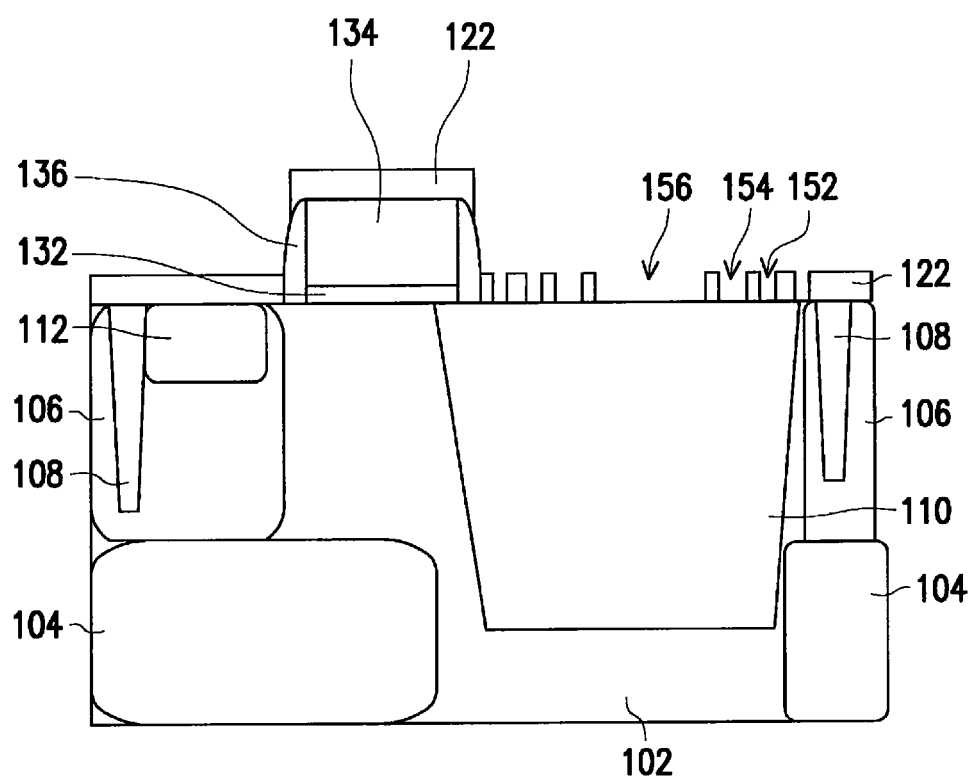

Referring to FIGS. 10-11, dielectric layer 122 is patterned to define the plurality of trenches 152, 154, 156, wherein the plurality of trenches comprises a plurality of peripheral trenches 152 and a center trench 156, as shown in FIG. 6. Referring to FIG. 6 and FIG. 11, each of the plurality of peripheral trenches 152 has an opening smaller than an opening of the center trench 156. The size of an opening is the dimension (e.g., a diameter or width) across a trench in a horizontal direction. The depth of a trench is the dimension from a top surface to a bottom surface in a vertical direction. Trenches 152, 154, 156 may have the same or different depths, in accordance with various embodiments.

In some embodiments, the plurality of trenches may further comprise a plurality of intermediate trenches 154 disposed between the center trench 156 and the plurality of peripheral trenches 152. Each of the plurality of intermediate trenches 154 has an opening greater than the opening of each of the plurality of peripheral trenches 152 while smaller than the opening of the center trench 156.

In some embodiments, step 206 comprises steps of: patterning a photoresist layer 157 on dielectric layer 122 by using a mask 158 having a plurality of openings 151, 153, 155, and etching dielectric layer 122 to define the plurality of trenches 152, 154, 156 corresponding to the plurality of openings 151, 153, 155. Each of the plurality of openings 151, 153, 155 is in any suitable shape such as a square or circular shape. Photoresist layer 157 is also patterned and etched to form a plurality of openings corresponding to the plurality of openings 151, 153, 155 on the mask 158. The number, shape, and size of the openings of the mask 158 and the trenches 152, 154, 156 may be determined by the doping concentration profile of the first photosensor region 110. One example of such a profile is illustrated in FIG. 4.

In some embodiments, patterning of dielectric layer 122 can be formed using processes such as: spin coating of a photoresist 157, patterning the photoresist 157, etching the photoresist 157 to provide a pattern, and using the photoresist pattern as a masking element to pattern dielectric layer 122, for example, using an etching process, and/or other suitable processes. Photoresist layer 157 can be applied after forming hard mask in some embodiments. Examples of a suitable process for etching dielectric layer 122 include but are not limited to a dry etch (e.g., RIE, plasma etch such as using fluorine-containing plasma). Photoresist layer 156 can be stripped by a solution comprising an ingredient such as $H_2SO_4$, $H_2O_2$, and $NH_4OH$.

Figure 12:
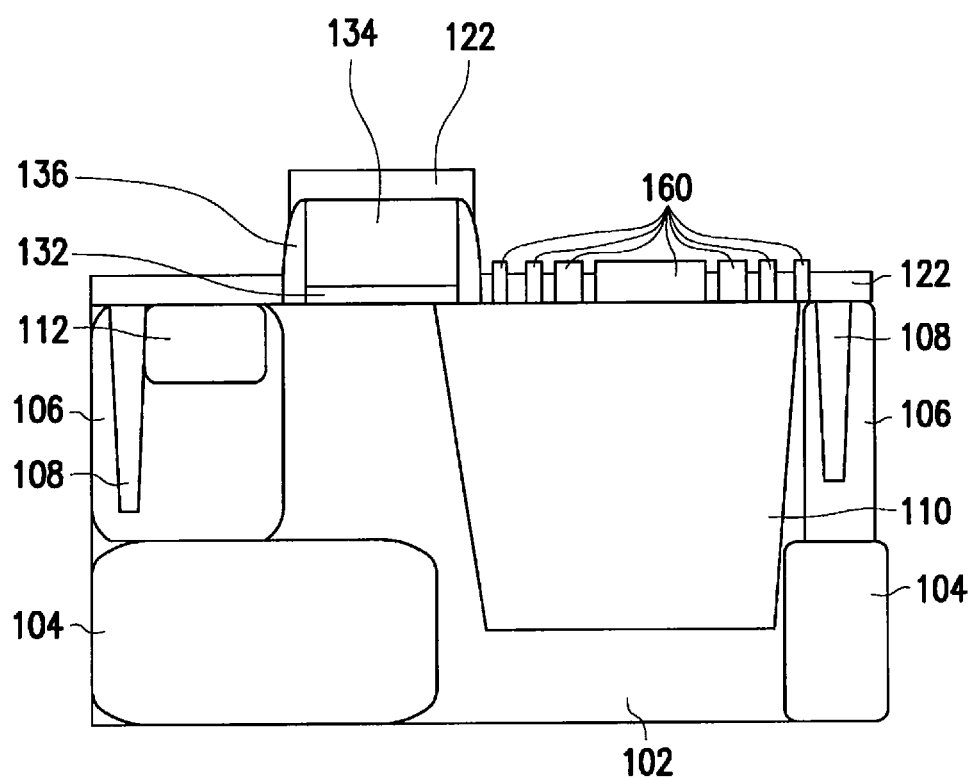

At step 208, a material comprising a second dopant 160 is deposited into the plurality of trenches 152, 154, and 156. The resulting structure is illustrated in FIG. 12. The second dopant of a second conductivity type being p-type or n-type.

In some embodiments, the first dopant for the first photosensor region 110 is n-type and the second dopant is p-type. For example, the material comprising a second dopant 160 comprises epitaxial silicon doped with a p-type dopant such as such as boron. Material comprising a second dopant 160 may comprise one or more p-type dopant in some embodiments.

Figure 13:
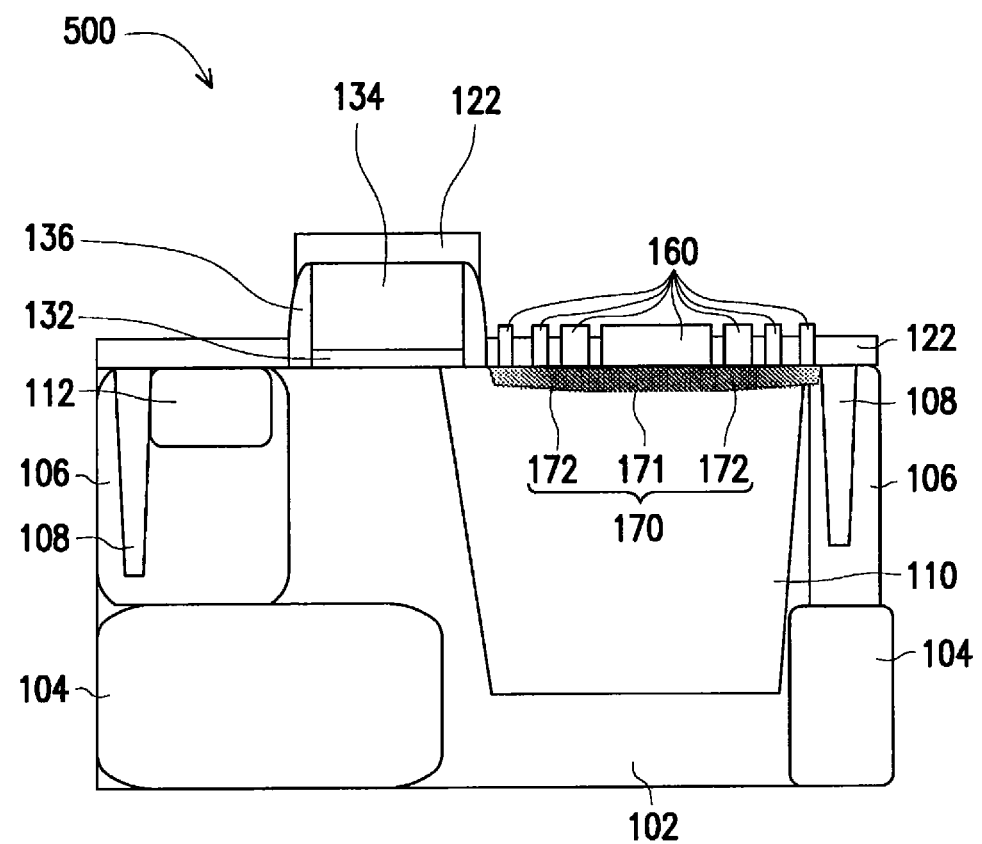
Figure 14:
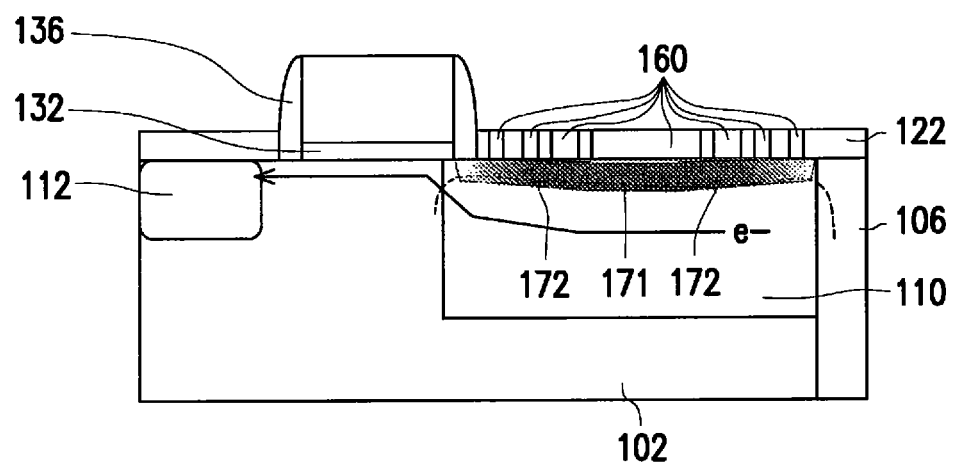
FIG. 14 illustrates a portion of the exemplary device of FIG. 13 having a first photosensor region, and a second photosensor region having a dopant concentration increase from an outer edge to a center portion therein.

At step 210, the device is annealed at an elevated temperature. The second dopant is driven into the first photosensor region 110 to form a second photosensor region 170 disposed above the first photosensor region 110. The resulting structure (e.g., exemplary device 500) is illustrated in FIGS. 13-14. The second photosensor region 170 has a composition similar to or identical to that of region 120 as described in FIG. 1. However, as described below, the second photosensor region 170 may have an increase in dopant concentration and/or doping depth from an outer edge to a center portion. The annealing step 210 is performed at an elevated temperature, for example, in a range of from 600° C. to 1200° C. for a time period, for example, in a range of from 0.5 minute to 30 minutes in some embodiments. After step 210, material 160 left in the trenches may be a part of the second photosensor region 170 or be removed.

Referring to FIGS. 13-14, exemplary device 500 comprises at least one pixel cell. Each pixel cell comprises substrate 102 comprising a semiconductor material, a first photosensor region 110, and a second photosensor region 170. The first photosensor region 110 is disposed in substrate 102 and comprises a first dopant of a first conductivity type being n-type or p-type. The second photosensor region 170 is disposed above the first photosensor region 110 and comprises a second dopant of a second conductivity type being p-type or n-type. The second photosensor region 170 has a dopant concentration increase, and/or an increase in doping depth toward the first photosensor region 110, from an outer edge 172 to a center portion 171 therein. The dopant concentration varies in horizontal direction from outer edge 172 to center portion 171. The doping depth or the depth of region 170 is measured vertically.

In some embodiments, the second photosensor region 170 has a continuous or step-wise gradient in dopant concentration extending from the outer edge 172 to the center portion 171. In addition, as illustrates in FIGS. 13 and FIG. 14, the second photosensor region 170 may have a greater dopant depth (or the depth of region 170) toward the first photosensor region 110 in the center portion than the outer edge. In some embodiments, the thickness of the first and the second photosensor regions 110 and 170 is in a range from 10 nm to 2 microns. The difference in the dopant depth in the second photosensor region 170 may be in a range of from about 5 nm to 1 micron (e.g., 50 nm-500 nm).

In some embodiments, the second photosensor region 170 has a continuous or step-wise gradient in dopant depth extending from the outer edge 172 to the center portion 171. dopant concentration. During step 210 of annealing, the second dopant 160 of a second conductivity type (e.g., p-type) penetrates into the first photosensor region 110 to form the second photosensor region 170 with depth variation. At the center of the second photosensor region 170, the second dopant 160 may be driven further and lower toward the top surface of the first photosensor region 110. The dopant concentration of the second dopant may be the same or different (e.g., in an increasing trend) horizontally from the outer edge 172 to the center portion of 171 of the second photosensor region 170. In some embodiments, the second photosensor region 170 has a continuous or step-wise gradient in both the dopant concentration and the dopant depth extending from the outer edge 172 to the center portion 171, as shown in FIGS. 13-14.

In some embodiments, the substrate, the first photosensor region 110 and the second photosensor region 170 comprise silicon. The substrate 102 comprises p-type doped silicon. The first dopant is n-type (e.g., P, As, or any combination thereof), and the first photosensor region 110 has a doping concentration in a range of from about $1\times10^{12}$ atom/cm$^3$ to about $1\times10^{13}$ atom/cm$^3$. The second dopant is p-type (e.g., boron), and in the second photosensor region 170 has a doping concentration in a range of from about $1\times10^{12}$ atom/cm$^3$ to about $1\times10^{13}$ atom/cm$^3$ at the outer edge 172 and a doping concentration in a range of from about $1\times10^{13}$ atom/cm$^3$ to about $1\times10^{14}$ atom/cm$^3$ at the center portion 171. The difference of the dopant concentration from edge 172 to the center portion 171 is in a range of from about $1\times10^{12}$ atom/cm$^3$ to about $8\times10^{12}$ atom/cm$^3$ (e.g., $3\times10^{12}$ or $5\times10^{12}$ atom/cm$^3$).

Referring to FIG. 13, the at least one pixel cell in exemplary device 500 may further comprise deep well region (e.g., a deep p-well region) 104 disposed substrate 102, cell well region (e.g., a cell p-well region) 106 disposed over deep well region 104, and STI structure 108 comprising an oxide disposed inside the cell well region. Deep well region 104 and cell well region 106 comprises a dopant of the second conductivity type. the at least one pixel cell in exemplary device 500 may further comprises transistor, gate structure comprising a conductive gate (e.g., a polysilicon or metal gate) 136, and drain region 112 comprising a dopant of a first conductivity type (e.g., N+ region) in cell well region 106. Light can be applied from bottom or from above. For example, light may be incident from above the pixel structure in device 500, or from a right or a left side at any angle in a range from 0.1 degree to 90 degrees off a horizontal top surface).

As illustrated in FIG. 14, resulting device 500 provides good electron pathways. Compared to an exemplary device having a greater doping depth illustrated in FIG. 3, device 500 provide shorter electron pathways, which are easier to photoelectrons to travel to region 112. Exemplary device 500 provides excellent dark current (DC) and the white pixel (WP) performance without no image lag.

In one aspect, the present disclosure provides a device comprising at least one pixel cell. Such a device comprises a substrate comprising a semiconductor material, a first photosensor region, and a second photosensor region. The first photosensor region is disposed in the substrate and comprises a first dopant of a first conductivity type being n-type or p-type. The second photosensor region is disposed above the first photosensor region and comprises a second dopant of a second conductivity type being p-type or n-type. The second photosensor region has a dopant concentration increase from an outer edge to a center portion therein.

In some embodiments, the substrate, the first photosensor region and the second photosensor region comprise silicon. The substrate comprises p-type doped silicon. The first dopant is n-type, and the first photosensor region has a doping concentration in a range of from about $1\times10^{12}$ atom/cm$^3$ to about $1\times10^{13}$ atom/cm$^3$. The second dopant is p-type, and in the second photosensor region has a doping concentration in a range of from about $1\times10^{12}$ atom/cm$^3$ to about $1\times10^{13}$ atom/cm$^3$ at the outer edge and a doping concentration in a range of from about $1\times10^{13}$ atom/cm$^3$ to about $1\times10^{14}$ atom/cm$^3$ at the center portion.

In some embodiments, the second photosensor region has a continuous or step-wise gradient in dopant concentration extending from the outer edge to the center portion. In addition, the second photosensor region may have a greater dopant depth toward the first photosensor region in the center portion than the outer edge.

The at least one pixel cell may further comprise a deep well region (e.g., a deep p-well region) disposed in the substrate, a cell well region (e.g., a cell p-well region) disposed over the deep well region, and a shallow trench isolation (STI) structure comprising an oxide disposed inside the cell well region. The deep well region and the cell well region comprising a dopant of the second conductivity type. In some embodiments, the at least one pixel cell further comprises a gate structure comprising a conductive gate (e.g., a polysilicon or metal gate) disposed above the substrate, and a drain region comprising a dopant of a first conductivity type (e.g., N+ region) and disposed in the cell well region.

In another aspect, a method of making a device comprising at least one pixel cell is provided. Such a method comprises the steps: providing a substrate comprising a semiconductor material, and forming a first photosensor region inside the substrate. The first photosensor region comprises a first dopant of a first conductivity type being n-type or p-type. The method further comprises steps of patterning a dielectric layer (e.g., silicon oxide layer) on a top surface of the first photosensor region, depositing a material comprising a second dopant of a second conductivity type being p-type or n-type into the plurality of trenches, and annealing the device so as to drive the second dopant into the first photosensor region and form a second photosensor region disposed above the first photosensor region. The dielectric layer defining a plurality of trenches, wherein the plurality of trenches comprises a center trench and a plurality of peripheral trenches, each of the plurality of peripheral trenches having an opening smaller than an opening of the center trench. In the resulting device, the second photosensor region has a dopant concentration increase from an outer edge to a center portion therein, or has an increase in doping depth toward the first photosensor region from the outer edge to the center portion therein.

The plurality of trenches may further comprise a plurality of intermediate trenches disposed between the center trench and the plurality of peripheral trenches. Each of the plurality of intermediate trenches has an opening greater than the opening of each of the plurality of peripheral trenches while smaller than the opening of the center trench.

In some embodiments, the step of patterning a dielectric layer comprises: patterning a photoresist layer on the dielectric layer by using a mask having a plurality of openings, and etching the dielectric layer to define the plurality of trenches corresponding to the plurality of openings. Each of the plurality of openings is in any suitable shape such as a square or circular shape.

In some embodiments. the substrate comprises silicon doped with a p-type dopant. The first photosensor region comprises silicon and the first dopant is n-type. The second photosensor region comprises silicon doped with a p-type dopant as the second dopant. The dielectric layer comprises silicon dioxide.

Such a method may further comprise the steps of forming a deep well region in the substrate, forming a cell well region over the deep well region, and forming a shallow trench isolation (STI) structure inside the cell well region. The deep well region and the cell well region comprises a dopant of the second conductivity type (e.g., p-type). In some embodiments, the method further comprises the steps of forming a drain region comprising a dopant of a first conductivity type (e.g., n-type, N+ region having high concentration of n-type dopant) in the cell well region, and forming a gate structure comprising a conductive gate above the substrate. The gate structure may also include a gate oxide layer below the conductive gate.

In some embodiments, a method of making a device comprising at least one pixel cell comprises steps of providing a substrate comprising p-type doped silicon, and forming a first photosensor region inside the substrate. The first photosensor region comprising silicon and a first dopant of n-type. Such a method also comprises a step of patterning a dielectric layer comprising silicon dioxide on a top surface of the first photosensor region. The dielectric layer defines a plurality of trenches, which comprises a center trench and a plurality of peripheral trenches. Each of the plurality of peripheral trenches has an opening smaller than an opening of the center trench. The method further comprises steps of depositing a material comprising a second dopant of p-type into the plurality of trenches, and annealing the device so as to drive the second dopant into the first photosensor region and form a second photosensor region disposed above the first photosensor region. The annealing is performed at an elevated temperature, for example, in a range of from 600° C. to 1200° C. for a time period, for example, in a range of from 0.5 minute to 30 minutes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising at least one pixel cell, the at least one pixel cell comprising:
   a first photosensor region comprising a first dopant of a first conductivity type; and
   a second photosensor region disposed above the first photosensor region and comprising a second dopant of a second conductivity type, wherein the second photosensor region has an increase in dopant depth toward the first photosensor region from an outer edge to a center portion therein; and
      a dielectric layer disposed above the second photosensor region, the dielectric layer defining a plurality of trenches, wherein the plurality of trenches comprise a center trench surrounded by a plurality of peripheral trenches, wherein each of the plurality of peripheral trenches has an opening smaller than an opening of the center trench; and
      a material comprising the second dopant disposed within each of the plurality of trenches.

2. The device of claim 1, wherein the first dopant is n-type, and the first photosensor region has a doping concentration in a range of from about $1\times10^{12}$ atom/cm$^3$ to about $1\times10^{13}$ atom/cm$^3$.

3. The device of claim 1, wherein the second dopant is p-type, and in the second photosensor region has a doping concentration in a range of from about $1\times10^{12}$ atom/cm$^3$ to about $1\times10^{13}$ atom/cm$^3$ at the outer edge and a doping concentration in a range of from about $1\times10^{13}$ atom/cm$^3$ to about $1\times10^{14}$ atom/cm$^3$ at the center portion.

4. The device of claim 1, wherein the second photosensor region has a continuous gradient in dopant concentration extending from the outer edge to the center portion.

5. The device of claim 1, wherein the second photosensor region has a greater dopant depth toward the first photosensor region in the center portion than the outer edge.

6. The device of claim 1, wherein the substrate, the first photosensor region and the second photosensor region each comprise silicon.

7. The device of claim 1, wherein the at least one pixel cell further comprises a deep well region disposed in the substrate, a cell well region disposed over the deep well region, and a shallow trench isolation (STI) structure comprising an oxide disposed inside the cell well region, wherein the deep well region and the cell well region comprising a dopant of the second conductivity type.

8. The device of claim 7, wherein the at least one pixel cell further comprises a gate structure comprising a conductive gate disposed above the substrate, and a drain region comprising a dopant of a first conductivity type and disposed in the cell well region.

9. A device comprising at least one pixel cell, the at least one pixel cell comprising:
   a substrate comprising a semiconductor material;
   a first photosensor region disposed in the substrate and comprising a first dopant of a first conductivity type;
   a second photosensor region disposed above the first photosensor region and comprising a second dopant of a second conductivity type, wherein the second photosensor region has an increase in dopant depth toward the first photosensor region from an outer edge to a center portion therein;
   a dielectric layer disposed above the second photosensor region, the dielectric layer defining a plurality of trenches, wherein the plurality of trenches comprise a center trench surrounded by a plurality of intermediate trenches, which are surrounded by a plurality of peripheral trenches, wherein each of the plurality of intermediate trenches has an opening greater than an opening of each of the plurality of peripheral trenches but smaller than an opening of the center trench; and
   a material comprising the second dopant disposed within each of the plurality of trenches.

10. The device of claim 9, wherein the first dopant is n-type, and the second dopant is p-type.

11. The device of claim 10, wherein the first photosensor region has a doping concentration in a range of from about $1\times10^{12}$ atom/cm$^3$ to about $1\times10^{13}$ atom/cm$^3$, and the second photosensor region has a doping concentration in a range of from about $1\times10^{12}$ atom/cm$^3$ to about $1\times10^{13}$ atom/cm$^3$ at the outer edge and a doping concentration in a range of from about $1\times10^{13}$ atom/cm$^3$ to about $1\times10^{14}$ atom/cm$^3$ at the center portion.

12. The device of claim 9, wherein the second photosensor region has a continuous gradient in dopant concentration extending from the outer edge to the center portion.

13. The device of claim 9, wherein the second photosensor region has a greater dopant depth toward the first photosensor region in the center portion than the outer edge.

14. The device of claim 9, wherein the at least one pixel cell further comprises a deep well region disposed in the substrate, a cell well region disposed over the deep well region, and a shallow trench isolation (STI) structure comprising an oxide disposed inside the cell well region, wherein the deep well region and the cell well region comprising a dopant of the second conductivity type.

15. The device of claim 14, wherein the at least one pixel cell further comprises a gate structure comprising a conductive gate disposed above the substrate, and a drain region comprising a dopant of a first conductivity type and disposed in the cell well region.

16. A device comprising at least one pixel cell, the at least one pixel cell comprising:
- a substrate comprising a semiconductor material;
- a first photosensor region disposed in the substrate and comprising a first dopant of a first conductivity type;
- a second photosensor region disposed above the first photosensor region and comprising a second dopant of a second conductivity type, wherein the second photosensor region has a dopant concentration increase from an outer edge to a center portion therein;
- a dielectric layer disposed above the second photosensor region, the dielectric layer defining a plurality of trenches, wherein the plurality of trenches comprise a center trench surrounded by a plurality of intermediate trenches, which are surrounded by a plurality of peripheral trenches, wherein each of the plurality of intermediate trenches has an opening greater than an opening of each of the plurality of peripheral trenches but smaller than an opening of the center trench; and
- a material comprising the second dopant disposed within each of the plurality of trenches.

17. The device of claim 16, wherein:
the first dopant is n-type, and the second dopant is p-type;
the first photosensor region has a doping concentration in a range of from about $1\times10^{12}$ atom/cm$^3$ to about $1\times10^{13}$ atom/cm$^3$; and
the second photosensor region has a doping concentration in a range of from about $1\times10^{12}$ atom/cm$^3$ to about $1\times10^{13}$ atom/cm$^3$ at the outer edge, and a doping concentration in a range of from about $1\times10^{13}$ atom/cm$^3$ to about $1\times10^{14}$ atom/cm$^3$ at the center portion.

18. The device of claim 16, wherein the second photosensor region has a continuous gradient in dopant concentration extending from the outer edge to the center portion.

19. The device of claim 16, wherein the second photosensor region has a greater dopant depth toward the first photosensor region in the center portion than the outer edge.

20. The device of claim 16, wherein the at least one pixel cell further comprises:
- a deep well region disposed in the substrate;
- a cell well region disposed over the deep well region; and
- a shallow trench isolation (STI) structure comprising an oxide disposed inside the cell well region, wherein the deep well region and the cell well region comprises a dopant of the second conductivity type, and wherein the at least one pixel cell further comprises a gate structure comprising a conductive gate disposed above the substrate, and a drain region comprising a dopant of a first conductivity type and disposed in the cell well region.

* * * * *